United States Patent [19]

Kruest

[11] Patent Number: 4,684,831
[45] Date of Patent: Aug. 4, 1987

[54] LEVEL SHIFT CIRCUIT FOR INTERFACING BETWEEN TWO DIFFERENT VOLTAGE LEVELS USING A CURRENT MIRROR CIRCUIT

[75] Inventor: James R. Kruest, Poway, Calif.

[73] Assignee: Applied Micro Circuits Corporation, San Diego, Calif.

[21] Appl. No.: 642,756

[22] Filed: Aug. 21, 1984

[51] Int. Cl.[4] ............... H03K 19/092; H03K 19/086; H03K 19/003; H03K 17/10
[52] U.S. Cl. ................................ 307/475; 307/455; 307/356; 307/358; 330/257; 323/316
[58] Field of Search ............... 307/454, 455, 456, 459, 307/467, 475, 355, 356, 358, 264, 260, 473, 551; 323/315–317; 330/257

[56] References Cited

U.S. PATENT DOCUMENTS

| 4,368,395 | 1/1983 | Taylor | 307/455 |
|---|---|---|---|
| 4,456,838 | 6/1984 | Taguchi et al. | 307/475 X |
| 4,485,318 | 11/1984 | Sano | 307/475 |
| 4,490,630 | 12/1984 | Freeman | 307/455 |
| 4,527,079 | 7/1985 | Thompson | 307/475 |
| 4,536,664 | 8/1985 | Martin | 307/475 |
| 4,578,602 | 3/1986 | West et al. | 307/475 |

OTHER PUBLICATIONS

AMCC Device Specification—"Q700 Series Logic Arrays", pp. 1–7.
"Speed/Power-Programmable Arrays Slash System Power Consumption", by Mark P. Huang, Richard W. Spehn & Ray C. Yuen, *EDN*, May 3, 1984.
AMCC Brochure—"Converting Your Designs into High Performance ECL/TTL Logic Arrays".

*Primary Examiner*—Stanley D. Miller
*Assistant Examiner*—David R. Bertelson
*Attorney, Agent, or Firm*—Brown, Martin, Haller & Meador

[57] ABSTRACT

A novel translator for translating linear logic signal levels to TTL-compatible levels in an integrated logic device having an I/O section including a mix of ECL and TTL circuit. The translator includes a resistive circuit connected to a current mirror and a linear buffer circuit connected between the resistive circuit and current mirror. The linear buffer responds to a linear logic signal by switching a current into and out of a portion of the resistive circuit which is added to or subtracted from the current mirror current flowing through the resistive network. The resulting variable current causes the resistive network to produce a TTL-compatible control voltage signal which drives a TTL buffer, causing it to produce standard TTL signals in response to linear logic signals applied to the linear buffer.

15 Claims, 4 Drawing Figures

LEVEL SHIFT CIRCUIT FOR INTERFACING BETWEEN TWO DIFFERENT VOLTAGE LEVELS USING A CURRENT MIRROR CIRCUIT

BACKGROUND OF THE INVENTION

This invention relates to circuitry for translating linear logic signals to TTL-compatible logic signals.

The requirement for programmable flexibility in many modern logic systems has given rise to logic circuitry which mixes high-speed linear logic, such as ECL, with digital circuitry, such as TTL, to provide the ability to custom-design logic systems. Increasingly, the combination of linear and digital circuitry has taken place on single very large scale integrated (VLSI) circuit devices. This permits one to produce standard programmable logic arrays which can be configured to the particular requirements of an individual user. An example of a logic array which combines linear and digital circuitry on a single VLSI device is the Q1500 array available from Applied Micro Circuits Corporation, San Diego, Calf., the assignee of the below-described invention.

Typically, such mixed-circuit devices include a central core area containing programmable linear logic circuitry, which is surrounded by one or more I/O sections. The translation circuitry necessary to adjust the characteristics of linear logic signal levels to standard digital logic levels is typically distributed between the logic core and the peripheral I/O sections. In the past, distribution of translation circuitry has led to the need to provide one or more positive voltage buses to the interior core area where the translation circuitry shifts the voltage level of the linear logic signals to a voltage level that is compatible with digital circuit operation. Since linear logic circuitry conventionally operates between a negative emitter voltage and ground, construction of a collector voltage bus to the interior logic core represents an added step in the device fabrication sequence. Moreover, the logic core is normally separated from the peripheral I/O section by an area across which a great many signal paths must be provided. Construction of one or more extra voltage buses in this area reduces the total area available for signal routing and complicates signal path layout.

Another problem characteristic of integrated circuit devices which mix logic families is associated with the fact that most of these circuits are constructed from bipolar circuit elements. Typically, the first step of translation involves shifting the linear voltage signals to a voltage level more compatible with digital signals. This frequently involves the provision of a collector voltage to a differentially-coupled, current-mode transistor pair. Under certain circumstances, when one of the transistor pair is turned off, the combination of the collector voltage and the emitter voltage required to operate the differential pair raises the collector-to-emitter voltage of the "off" transistor to a level exceeding the breakdown for the manufacturing process used.

SUMMARY OF THE INVENTION

The present invention overcomes the deficiencies of prior art integrated signal translators by providing a linear buffer section for translating a linear, current-mode logic signal to a voltage level compatible with digital logic operation that obtains a collector voltage in the I/O portion of a mixed logic family integrated circuit. Moreover, the level of the collector voltage obtained in the I/O section insures that the collector-to-emitter voltage of a differential transistor pair used to effect the level shifting will not be exceeded when one of the transistor pair is turned off.

These improvements are realized in a translator circuit for converting a linear, current-mode differential signal having one operating voltage range to a digital logic signal in another range. The digital logic signal voltage range is established by reference to a voltage source providing a predetermined operating voltage. The novel circuit of the invention includes a current mirror for providing a current of predetermined magnitude. A resistive circuit is connected between the current mirror and the voltage source and is responsive to the current mirror current for providing a digital gate control signal. An input buffer circuit is connected between the resistive circuit and the current mirror and is also connected to receive a linear differential signal for varying, in response to the linear differential signal, the control signal over a range which is compatible with a family of digital logic. In expanded form, the circuit of the invention also includes a TTL buffer circuit having a totem-pole output.

It is therefore an object of the present invention to provide an improved circuit for translating linear, current-mode logic signals to digital logic signals.

A further object of the present invention is to provide such a translation circuit for use in an integrated circuit combining both linear logic circuitry and digital circuitry.

Another object of the present invention is to provide such a circuit which does not result in the generation of a voltage exceeding the collector-to-emitter breakdown voltage of a non-operating bipolar transistor.

A still further object of the present invention is to provide such a circuit which eliminates the need for laying a collector voltage bus between the area of an integrated circuit containing linear logic circuitry and another area of the same integrated circuit containing digital logic circuitry.

These and other objects of the present invention will become more evident when the following description is read in light of the below-described drawings.

DETAILED DESCRIPTION OF THE PREFERRED EMBODIMENT

Available programmable logic arrays combine both linear, current-mode logic circuits, such as ECL, with digital circuitry, such as TTL, to realize the benefits of high-speed logic operation in conjunction with the advantages of noise-tolerant digital logic interfaces. Increasingly, VLSI circuitry is being manufactured which combines current-mode and digital circuitry on a single integrated circuit device.

Typically, current-mode and digital circuits are not distributed randomly on the integrated circuit device, but rather, the current-mode circuits are gathered in a central portion of the chip which is surrounded by I/O cells including the TTL circuitry. In such circuits, current-mode signals are developed from linear, differentially-operating circuits which switch a current between a pair of differentially-coupled transistors. Such circuits are usually operated between a negative emitter voltage supply and a ground, or zero-level collector voltage. On the other hand, TTL circuits conventionally produce a voltage signal from a transistor circuit which operates between a positive collector voltage and a zero or grounded emitter voltage. Integrated circuits which combine both types of logic circuits on a single chip require translator circuitry which is dedicated to translating current-mode, linear logic signals to voltage-mode, digital signals.

Figure 1:
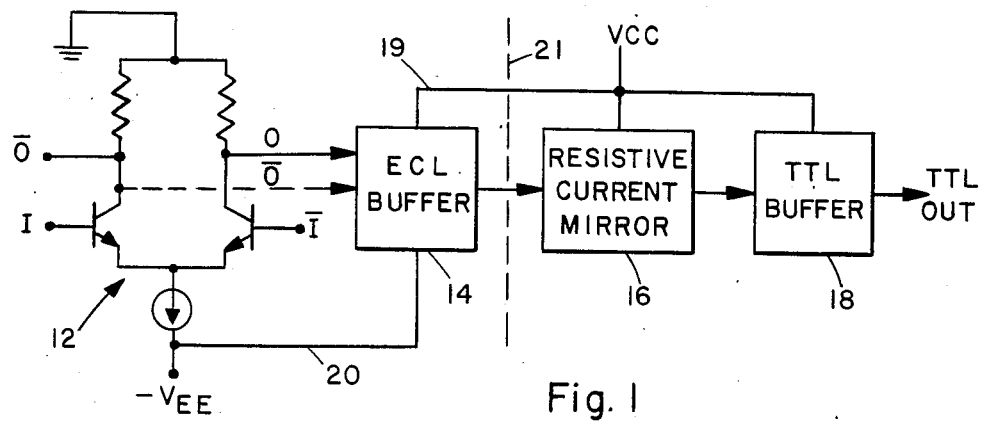
FIG. 1 is a circuit/functional block diagram representative of a conventional circuit for translating linear logic signals to TTL-compatible signals.

Such translator circuits have in the past typically included elements illustrated in FIG. 1. As shown in FIG. 1 a typical linear logic circuit 12 includes a pair of differentially-coupled transistors which respond to a pair of complementary, differential input signals I and $\bar{I}$ to produce a pair of complementary output signals $\bar{O}$ and O. As shown, the linear logic circuit 12 operates by switching current from a current source, such as a transistor operating with an emitter voltage $-V_{EE}$. The current is switched between the transistor pair which operate off of a collector voltage at or near ground.

Although the linear logic circuit 12 comprises a conventional differential amplifier, when employed as a logic circuit, it is characteristically designated as an emitter coupled logic (ECL) circuit. Hereinafter, the terms "linear" and "ECL" will be used interchangeably.

To translate the signals provided by the linear logic circuit 12, a signal translator, including an ECL buffer 14, a resistive current mirror 16, and a TTL buffer 18 are connected in series between the output of the linear logic circuit 12 and an output node carrying a TTL-compatible output signal, TTL OUT.

Conventionally, the ECL buffer 14 is provided to receive one or both of the differential output signals O, $\bar{O}$ from the linear logic circuit 12, and to shift the voltage level of one of those signals to a voltage level which lies in the acceptable input signal voltage range of a TTL circuit. The voltage-shifted signal is provided to the resistive current mirror 16. As is conventional, the current mirror portion of the circuit 16 provides a constant current. The constant current flows through a resistive network to develop a quiescent gate control signal voltage which lies within the input signal range of the TTL buffer 18. The signal from the ECL buffer 14 is used to vary the current mirror current by a positive or negative amount in response to the linear signal input to the linear logic circuit 12. The varying current causes the gate control signal voltage provided to the TTL buffer 18 to vary within the TTL input signal operating range, which causes the TTL buffer 18 to output a TTL signal which varies according to the linear signal input to the linear logic circuit 12.

Also shown in FIG. 1 is a typical voltage source arrangement for the translator circuit of FIG. 1. The positive collector voltage $V_{CC}$ necessary to drive TTL circuitry is provided to both TTL buffer 18 and the ECL buffer 14 on a conventional integrated circuit voltage bus 19. Similarly, the negative emitter voltage $-V_{EE}$ is provided on another voltage bus 20. As explained below, the linear logic circuit 12 and ECL buffer 14 are typically confined to a designated central sector of an integrated circuit device, while the current mirror 16 and TTL buffer 18 are placed in another sector of the device reserved for TTL I/O circuit elements. The spatial division between the linear and I/O sectors is symbolized by the dotted line 21.

Figure 2:
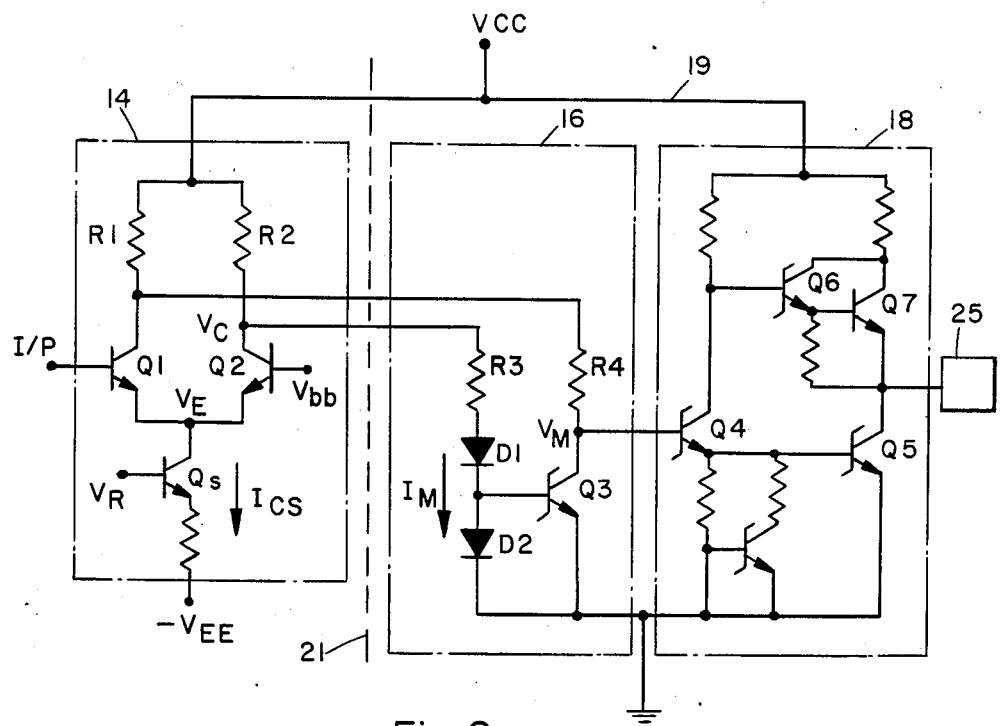
FIG. 2 is a detailed circuit diagram illustrating one such prior art translator circuit.

The circuit of FIG. 2 is a more complete representation of the elements 14, 16 and 18 of FIG. 1. The FIG. 2 circuit represents an actual circuit design incorporating a device produced by the assignee of this patent application. The device was a mixed linear and digital logic array designated as AMCC Device Q7000-0016. Level translation is provided by the ECL buffer 14 which includes a pair of matched transistors $Q_1$ and $Q_2$ whose collectors are connected through parallel resistors $R_1$ and $R_2$ to $V_{CC}$. As is conventional, the emitters of the matched transistor pair are connected in common at node $V_E$ to the collector of a constant current transistor $Q_S$. The transistor $Q_S$ is biased to provide a constant forward current $I_{CS}$ which is switched back and forth between the transistor pair.

The transistor pair of the ECL buffer 14 responds to one of a pair of complementary differential signals available from a linear logic circuit such as the circuit 12 of FIG. 1. In this instance, the transistor $Q_1$ takes the complementary signal as an input (I/P) signal to its base, while the transistor $Q_2$ is biased in its linear region by a bias voltage $V_{bb}$.

The buffer 14 of FIG. 2 thus is set up to operate single-endedly off of the output of a linear logic circuit. For example, either of the output signals O or $\bar{O}$ provided by the circuit 12 of FIG. 1 can function as the input I/P. Of course, the transistor pair $Q_1$ and $Q_2$ can be driven in the standard double-ended or common mode fashion by providing the unused output signal of the linear logic circuit as the input to the base of the transistor $Q_2$.

The resistive current mirror 16 has a resistive section including a pair of matched resistors $R_3$ and $R_4$ having equal resistance values. In one side of the resistive network, the resistor $R_3$ is connected between the collector of $Q_2$ and a conventional diode $D_1$. The other side of the resistive network consists of the resistor $R_4$ connected between the collector of the transistor $Q_1$ and a transistor $Q_3$. The current mirror portion of the resistive current mirror 16 includes a diode $D_2$ and the transistor $Q_3$ with the diode $D_2$ connected across the base-emitter junction of the transistor. The anode of the diode $D_2$ and the base of the transistor $Q_3$ are connected in common to the cathode of the diode $D_1$. The cathode and emitter of the current mirror devices are connected in common to ground. The output of the resistive current mirror 16 is provided as a TTL gate control signal voltage $V_M$ which is developed on the collector of the transistor $Q_3$.

The signal $V_M$ is fed as the input control voltage to the TTL buffer 18. The buffer 18 includes a conventional phase-splitter transistor $Q_4$ that, in response to the gate control signal, produces a pair of complementary voltages that drive transistors $Q_5$–$Q_7$. Details regarding the operation of the TTL buffer can be understood with reference to any available publication describing digital logic circuitry. See, for example, U.S. Pat. No. 4,311,927. The TTL buffer 18 in response to the signal $V_M$ provides an output TTL-compatible signal between the collector of totem-pole transistor $Q_5$ and the emitter of totem-pole transistor $Q_7$. The output is made available on a conventional metallized pad 25.

Figure 3:
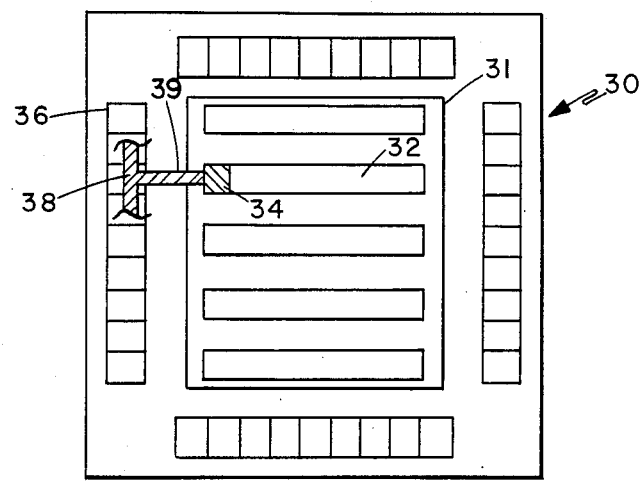
FIG. 3 is a representational plan view of the layout of an integrated circuit using the FIG. 2 translation circuit.

With reference now to FIG. 3, the problems mentioned hereinabove with respect to translation circuits represented by FIGS. 1 and 2 can be understood. In FIG. 3, a conventional semiconductor integrated circuit 30 includes a central logic core 31 comprising an array of conventionally-formed linear logic circuits which are interconnected into a programmed logic array by known semiconductor processing techniques. Included in the array is a strip 32 of linear logic elements at one end 34 of which is located one or more linear buffers, such as the buffer 14 of FIGS. 1 and 2, which serve to interface linear, current-mode logic signals between the logic core 31 and one or more digital TTL I/O drivers in a strip 36 of I/O circuits. This arrangement provides for ease of access to the logic functions on the chip through the I/O strips which are located on the periphery of the device 30 where the physical interconnections are to be made with other integrated circuit devices. The circuits in the I/O strips are also formed by conventional semiconductor processing techniques and include metallized contacts such as the pad 25 of the FIG. 2 circuit for inter-device circuit connection.

For the integrated circuit organization of FIG. 3, the linear circuit buffer 14 is normally confined to the logic core sector 31 because the techniques employed to fabricate it are those employed to fabricate the other elements of the logic core. Similarly, the resistive current mirror 16 and TTL buffer 18 are formed in the I/O strips for the same reason. However, as described above, the buffer circuit 14 requires the potential provided by $V_{CC}$ to effect voltage translation of the linear logic signal to above-ground levels suitable for controlling the TTL buffer 18. In order to provide the $V_{CC}$ potential to linear buffers such as the buffer 14 in the logic core 31, an extension 39 of an I/O circuit $V_{CC}$ bus 38 is constructed to span the space between the I/O strip 36 and the logic core 31, creating placement and routing difficulties in view of the myriad of signals required to be transferred across the same span. Further, the requirement for provision of $V_{CC}$ to the buffer 14 means that the buffer must be placed at the edge of the logic core 31 so that the extension 39 of the $V_{CC}$ bus 38 can most conveniently be brought to the buffer. As is known, restricted placement of any type of logic or buffer cell is generally undesirable in a gate array. The intrusion of a $V_{CC}$ bus into the core area 31 represents a blockage to an area normally available to inter-cell signal routes, which again, represents another constraint complexifying the layout of the circuit 30.

Finally, consider the situation where, in FIG. 2, the input signal I/P is at $-0.8$ v (logic high), placing $V_E$ (the emitters of $Q_1$ and $Q_2$) at $-1.6$ v. In this state, $I_{CS}$ flows through $R_1$, and the mirror current $I_M$ flows through $R_2$. The magnitude of the mirror current $I_M$ is given by equation (1).

$$I_M = \frac{V_{cc} - 2V_d}{R_3 + R_2} \quad (1)$$

In equation (1), $V_d$ is the voltage drop of a foreward-biased diode or transistor base-emitter junction. Typically $V_d = 0.8$ v.

The collector voltage $V'_C$ of the off transistor $Q_2$ is the difference between the collector voltage $V_{CC}$ and the voltage drop through $R_2$ caused by the mirror current $I_M$. This is expressed by equation (2).

$$V_C' = V_{CC} - \frac{R_2}{R_3 + R_2}(V_{cc} - 2V_d) \quad (2)$$

By design, $R_2 = 1131$ ohms and $R_3 = 1700$ ohms. Now, when $V_{CC}$ goes to its maximum value, 5.5 v, the magnitude of $V'_C$ is given by equation (3).

$$V_C = 5.5\text{ v} - \frac{1131}{1700 + 1131}(5.5\text{ v} - 1.6\text{ v}) = 3.9\text{ v} \quad (3)$$

Using the value calculated in equation (3), one can see that the collector-emitter voltage of the transistor $Q_2$ is given by equation (4).

$$V_{CE}(Q_2) = V_C - V_E = 5.5v \quad (4)$$

It is possible for a $V_{CE}$ value of 5.5 v to exceed the breakdown voltage $BV_{CEO}$ of transistors formed using a silicon fabrication process in the logic core 31.

Figure 4:
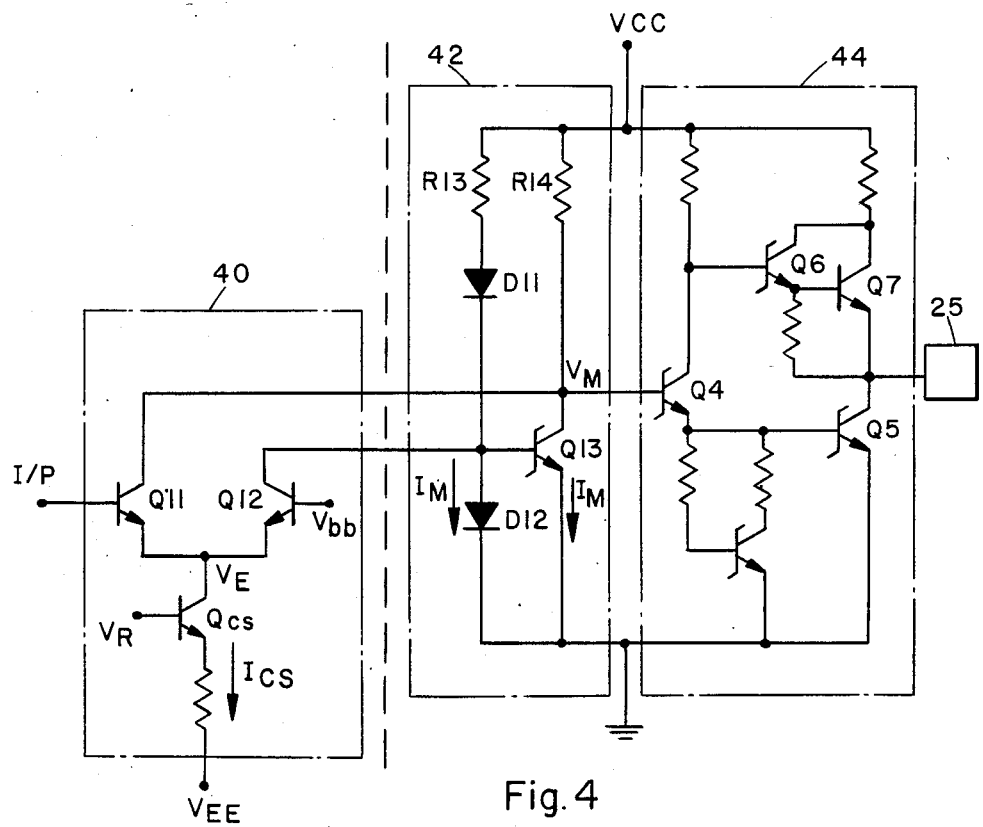
FIG. 4 is a schematic diagram illustrating the translator circuit of the invention.

The solution to the problems discussed above resides in the circuit illustrated in FIG. 4. Essentially, the approach of the circuit of FIG. 4 is to vary the current in the resistive section of the current mirror by the addition or subtraction of the differential current $I_{CS}$. This is in contradistinction to the approach of the FIG. 2 translation circuit which is to vary the current through the resistive current mirror by varying the voltage across it.

In FIG. 4, a linear logic signal buffer 40 includes differentially-connected transistors $Q_{11}$ and $Q_{12}$ whose emitters are connected in common to the collector of a current source transistor $Q_{CS}$. The transistor $Q_{CS}$ is biased to provide a current $I_{CS}$ to the differentially-connected transistors. The base of the transistor $Q_{11}$ is connected to receive one of a pair of complementary signals output by a linear logic circuit such as the circuit 12 of FIG. 1. The base of the transistor $Q_{12}$ is connected to a source of constant voltage $V_{bb}$, equal to approximately $-1.0$ v.

A resistive current mirror 42 has a resistive section comprising parallel resistors $R_{13}$ and $R_{14}$, of equal value, connected in common to $V_{CC}$. The resistor $R_{13}$ is connected through a diode $D_{11}$ to a current mirror including a diode $D_{12}$ and a transistor $Q_{13}$. The anode of the diode $D_{12}$, the base of the transistor $Q_{13}$, the cathode of the diode $D_{11}$ and the collector of the transistor $Q_{12}$ are all connected together at a common point. The other side of the resistor $R_{14}$ is connected in common with the collectors of transistor $Q_{11}$ and the current mirror transistor $Q_{13}$. The cathode and emitter of the diode $D_{12}$ and the transistor $Q_{13}$, respectively, are connected in common to ground.

A gate control signal voltage $V_M$ is developed at the common connection of the resistor $R_{14}$, the transistor $Q_{11}$, and the transistor $Q_{13}$. The gate control voltage is fed into a TTL buffer, identical in all respects with the buffer 18. The gate control voltage is fed to the base of the phase-splitter transistor $Q_4$ of the TTL buffer 44.

The quiescent operation of the resistive current mirror is established by the forward conducting characteristics of the diode $D_{12}$ and the transistor $Q_{13}$. In practice, since the elements of FIG. 4 are all formed on the same integrated circuit device by a standard silicon semiconductor fabrication process, the forward conducting characteristics of the diode $D_{12}$ and transistor $Q_{13}$ can be closely matched by, for example, forming $D_{12}$ from a transistor identical to the transistor $Q_{13}$ whose base and collector are shorted together. Since the forward voltage drops across the diode $D_{12}$ and the transistor $Q_{13}$ are equal, their forward currents will be substantially equal, disregarding the base current of the transistor $Q_{13}$. Therefore the currents through $R_{13}$ and $R_{14}$ which are due to the current mirror will be equal as will be their resulting voltage drops. Since the voltage at the junction between the resistor $R_{13}$ and the diode $D_{11}$ is equal to the forward diode drops across the two diodes $D_{11}$ and $D_{12}$, i.e. $2V_d$, the voltage $V_M$ on the collector of the transistor $Q_{13}$ that is due to the current mirror current $I_M$ will also equal $2V_d$.

Therefore, the quiescent control voltage which is input to the TTL buffer 44 is equal to $2\ V_d$. Since the phase-splitter transistor $Q_4$ will be turned on by a voltage large enough to forward bias the base emitter junctions of itself and the totem-pole transistor $Q_5$, the quiescent value of $V_M$ places the transistor $Q_4$ at the threshold of operation.

Through the action of the linear buffer 40, the current $I_{CS}$ is added to or subtracted from the current flowing through the resistor $R_{14}$. This causes the voltage $V_M$ to try to vary about the quiescent value of $2\ V_d$ by the amount $I_{CS} \times R_{14}$. This variation will cause the phase-splitter transistor $Q_4$ to turn on or turn off in phase with the direction of the change of the magnitude of $V_M$. It should be evident, however, that when $V_M$ attempts to rise by virtue of the addition of $I_{CS}$ to the current flowing through the resistor $R_{13}$, it will be clamped by the base-to-emitter voltages of the transistors $Q_4$ and $Q_5$ to slightly more than $2\ V_d$.

In operation, then, when the input signal I/P is at $-1.3$ v (logic low), the transistor $Q_{11}$ switches off, while the transistor $Q_{12}$ turns on. With the transistor $Q_{12}$ switched on, the current $I_{CS}$ is switched through $R_{13}$, and the loop equation for the potential at the point where $V_M$ is measured is given by equation (5).

$$V_M + I_M R_{14} - I_M R_{13} - I_{CS} R_{13} - 2V_d = 0 \quad (5)$$

This reduces to the expression of equation (6).

$$V_M = 2V_d + I_{CS} R_{13} \quad (6)$$

Thus, according to equation (6), the TTL gate control voltage attempts to rise. This will turn on the phase-splitter transistor $Q_4$ and the totem-pole transistor $Q_5$, and clamp $V_M$ at a level slightly above the combination of the forward base-emitter drops of the transistors $Q_4$ and $Q_5$. As is conventional, when $Q_5$ is biased on, the TTL gate voltage available on the contact 25 will be near ground, which is equivalent to the logic low level for TTL circuitry.

Similarly, when the input linear logic signal I/P is at $-0.8$ v (logic high), the current $I_{CS}$ is switched into the leg of the resistive portion of the resistive current mirror containing the resistor $R_{14}$. In this case, the potential of the voltage $V_M$ is given by equation (7).

$$V_M = 2V_d - I_{CS} R_{14} \quad (7)$$

With the potential of $V_M$ taken below $2\ V_d$, the phase-splitter transistor $Q_4$ is turned off, which turns off the totem-pole transistor $Q_5$. At the same time, the base of the TTL buffer transister $Q_6$ rises toward $V_{CC}$, turning on the transistors $Q_6$ and $Q_7$. When the totem-pole transistor $Q_5$ turns off, the potential of the output voltage signal at the contact 25 rises toward $V_{CC}$, which is the positive logic level for TTL circuitry.

As the above description of the operation of the FIG. 4 circuit shows, the output TTL-compatible signal available at the output contact 25 varies directly with the input linear logic level signal provided to the base of the transistor $Q_{11}$. It should be manifest that the output signal available at the contact 25 can be either in phase with or the complement of the output of the linear logic circuit providing the input signal to the buffer 40, depending upon which of the complementary signals available from the circuit is provided as the input signal I/P. It should also be evident that the TTL gate control signal voltage $V_M$ will try to vary symmetrically about its quiescent point, $2\ V_d$, since $R_{13} = R_{14}$.

As an inspection of the signal translator circuit of FIG. 4 reveals, the novel interconnection of the linear logic buffer 40 and the resistive current mirror 42 dispenses with the need to provide a $V_{CC}$ bus into the logic core for the linear buffer 40, since the buffer 40 obtains its collector voltage through its signal connection to the resistors $R_{13}$ and $R_{14}$. Furthermore, when I/P is at $-1.3$v (logic low), the transistor $Q_{11}$ is off and the transistor $Q_{12}$ is on. This places the emitter voltage of the transistor $Q_{12}$ at a potential equal to $V_{bb} - V_d$, approximately $-1.8$v. Since $V_M$ is clamped at slightly more than $2V_d$, approximately 1.8v, the collector-emitter voltage across the transistor $Q_{11}$ is equal to $V_M - V_E$, approximately 3.4 v. Similarly, when I/P is at $-0.8$v (logic high), $V_E$ is at approximately $-1.6$v. In this case, the transistor $Q_{12}$ is turned off and its collector is at a potential equal to the forward drop across the diode $D_{12}$, approximately 0.8v ($V_d$). This yields a collector-emitter voltage across the transistor $Q_{12}$ of 2.4v. Thus, the voltage translator circuit of FIG. 4 reduces the potential for breakdown of either of the transistors $Q_{11}$ or $Q_{12}$.

Obviously, many modifications and variations of the described embodiment are possible in light of the above teachings, and it is therefore understood that the invention may be practiced otherwise than as specifically described.

I claim:

1. An interface circuit for converting a linear differential signal having a predetermined operating voltage range to a digital logic control signal having another predetermined operating voltage, comprising:
   a digital logic voltage source;
   current mirror means for continuously providing a mirror current of predetermined magnitude;
   resistive circuit means connected between said current mirror means and said digital logic voltage source for generating a digital logic control signal in response to a total current which includes said mirror current;
   an output node directly connecting said resistive circuit means and said current mirror means through which said total current flows and at which said digital logic control signal is generated; and
   input buffer means connected to said output node for generating a differential current and for varying said total current by switching said differential current through said output node in response to said linear differential signal.

2. The circuit of claim 1 wherein said resistive circuit includes a pair of resistors, said input buffer means includes a pair of differentially-coupled transistors, each of said transistors having a collector connected to a respective one of said resistors and to said current mirror means, and said output node forms the connection between one of said collectors and one of said resistors.

3. The circuit of claim 2 integrated with a TTL logic circuit.

4. An interface translator formed in an integrated circuit for translating differential linear signals developed in a first predetermined area of said integrated circuit into TTL-compatible signals to be made available at a second predetermined area of said integrated circuit, said interface translator comprising:
a digital logic voltage connection;
a current mirror continuously providing a mirror current of predetermined magnitude;
a resistive circuit connected between said digital logic voltage connection and said current mirror for generating a digital logic control signal in response to a total current which includes said mirror current;
and output node directly connecting said resistive circuit means and said current mirror means, through which said total current flows and at which said digital logic control signal is generated; and
linear buffer means connected to said output node for generating a differential current and for varying said total current by switching said differential current through said output node in response to said linear differential signal; and
a TTL buffer circuit connected to said output node for providing a TTL output signal corresponding to said linear signal in response to said digital logic control signal.

5. The translator of claim 4 wherein said resistive circuit includes a pair of resistors, said linear buffer means includes a pair of differentially-coupled transistors, each of said transistors having a collector connected only to a respective one of said resistors and to said current mirror, and said output node forms the connection between one of said collectors and one of said resistors.

6. The translator of claim 5 wherein said linear buffer means is formed in said first predetermined area and said resistive circuit, current mirror, and TTL buffer circuit are formed in said second predetermined area.

7. A circuit for adjusting the voltage level of a linear differential signal to a digital voltage level referenced to a digital voltage source, comprising:
a digital voltage source;
current means for providing an uninterrupted mirror current having a predetermined magnitude;
resistive circuit means coupled between said digital voltage source and said current means and responsive to a total current including said mirror current for providing a digital voltage adjustment signal having a quiescent level determined by said predetermined magnitude of said mirror current and having a magnitude which varies about said quiescent level with variations in said total current;
differential current switching means for generating a differential current in response to said linear differential signal and for varying said total current by adding said differential current to said total current or subtracting said differential current from said total current, which causes the magnitude of said voltage adjustment signal to vary about said quiescent level; and
an output node connecting said current means, said resistive circuit means, and said differential current switching means, where said digital voltage adjustment signal is provided.

8. The circuit of claim 7 wherein said current means includes a current mirror.

9. The circuit means of claim 8 wherein said resistive circuit includes a pair of resistors coupled in parallel between said current mirror and said digital voltage source.

10. The circuit of claim 9 wherein said differential current switching means includes a pair of differentially-connected transistors, each having a collector connected only to a respective one of said resistors and said current mirror.

11. The circuit of claim 7 wherein said digital logic voltage level is a TTL-compatible voltage level.

12. The circuit of claim 11 further including a TTL-compatible buffer means connected to said output node and responsive to said voltage adjustment signal for providing a TTL-compatible output signal whose characteristics are determined by the characteristics of said linear differential signal.

13. The circuit of claim 12 formed in an integrated circuit.

14. The circuit of claim 13 wherein said differential current switching means is formed in a portion of said integrated circuit containing linear logic circuits and the current means, resistive circuit means, and TTL-compatible buffer means are all formed in another, separate portion of said integrated circuit containing I/O circuits.

15. The circuit of claim 14 wherein said logic circuit portion is located substantially in the center of said integrated circuit and said I/O circuit portion is located around the periphery of said logic current position.

* * * * *